(12) United States Patent
Robinson (10) Patent No.: US 9,912,448 B2
(45) Date of Patent: Mar. 6, 2018

(54) TESTING APPARATUS FOR A HIGH SPEED COMMUNICATIONS JACK AND METHODS OF OPERATING THE SAME

(71) Applicant: SENTINEL CONNECTOR SYSTEMS, INC., York, PA (US)

(72) Inventor: Brett D. Robinson, Chino, CA (US)

(73) Assignee: Sentinel Connector Systems, Inc., York, PA (US)

( * ) Notice: Subject to any disclaimer, the term of this patent is extended or adjusted under 35 U.S.C. 154(b) by 238 days.

(21) Appl. No.: 14/223,364

(22) Filed: Mar. 24, 2014

(65) Prior Publication Data
US 2014/0204788 A1  Jul. 24, 2014

Related U.S. Application Data (63) Continuation-in-part of application No. 13/739,214, filed on Jan. 11, 2013, now Pat. No. 8,858,266.
(Continued)

(51) Int. Cl.
*H04L 1/24* (2006.01)
*H04B 17/00* (2015.01)
(Continued)

(52) U.S. Cl.
CPC ........... *H04L 1/24* (2013.01); *H01R 13/6469* (2013.01); *H01R 13/6474* (2013.01); *H04B 17/00* (2013.01); *H05K 1/025* (2013.01); *G01R 1/0416* (2013.01); *H01R 24/64* (2013.01); *H05K 2201/09027* (2013.01); *H05K 2201/10189* (2013.01)

(58) Field of Classification Search
None
See application file for complete search history.

(56) References Cited

U.S. PATENT DOCUMENTS 4,672,312 A * 6/1987 Takamine .......... G01R 1/07307
                                                324/750.09
4,791,722 A * 12/1988 Miller, Jr. .............. H05K 1/029
                                                174/262
(Continued)

FOREIGN PATENT DOCUMENTS

WO      2011096970 A1    8/2011

OTHER PUBLICATIONS

"XT/duroid™ 8100 High Frequency Materials Data Sheet", Rogers Corporation, Advanced Circuit Materials Division, Chandler AZ, Dec. 16, 2010.*
(Continued)

*Primary Examiner* — Jeffrey M Rutkowski
*Assistant Examiner* — Jonathan B Wood
(74) *Attorney, Agent, or Firm* — Vedder Price P.C.

(57) ABSTRACT

A testing unit including a substrate, a plurality of vias located in the substrate, a plurality of pin traces having a height and a width and each extending from a respective via towards an edge of the substrate, a plurality of end traces having a height and a width with each end trace extending from an end of a respective pin trace towards the edge of the substrate, a plurality of branch traces having a height and a width and each extending from a side of a respective pin trace, a plurality of traces extending from the end of a respective end trace, branch trace or pin trace to the edge of the substrate.

20 Claims, 5 Drawing Sheets

Related U.S. Application Data (60) Provisional application No. 61/598,288, filed on Feb. 13, 2012.

(51) Int. Cl.
*H01R 13/6474* (2011.01)
*H01R 13/6469* (2011.01)
*H05K 1/02* (2006.01)
*H01R 24/64* (2011.01)
*G01R 1/04* (2006.01)

(56) References Cited

U.S. PATENT DOCUMENTS

| | | | | |
|---|---|---|---|---|
| 4,825,340 | A * | 4/1989 | Lewis | H01L 21/4839 228/122.1 |
| 4,831,497 | A * | 5/1989 | Webster | H05K 1/0228 174/32 |
| 4,851,794 | A * | 7/1989 | Williams | H01P 5/08 324/537 |
| 4,951,123 | A * | 8/1990 | Lee | H01L 23/64 257/720 |
| 5,229,639 | A * | 7/1993 | Hansen | H01L 23/4951 257/666 |
| 5,229,960 | A * | 7/1993 | De Givry | H01L 25/0652 257/E25.011 |
| 5,502,391 | A * | 3/1996 | Sciacero | H04B 3/487 324/628 |
| 5,556,296 | A * | 9/1996 | Dussausse | H01R 4/2429 439/404 |
| 5,612,575 | A * | 3/1997 | De Givry | H01L 23/5385 257/723 |
| 5,618,185 | A * | 4/1997 | Aekins | H01R 31/065 174/34 |
| 5,629,838 | A * | 5/1997 | Knight | G01R 31/3025 257/E23.01 |
| 5,731,709 | A * | 3/1998 | Pastore | G01R 1/0483 324/750.05 |
| 5,923,565 | A * | 7/1999 | Smith | G06F 17/5036 703/4 |
| 6,231,397 | B1 * | 5/2001 | de la Borbolla | H01R 13/6477 439/676 |
| 6,316,326 | B1 * | 11/2001 | Kao | H01L 27/0805 257/E21.396 |
| 6,646,521 | B1 * | 11/2003 | Huang | H01L 23/66 333/247 |
| 6,663,423 | B2 | 12/2003 | Belopolsky et al. | |
| 6,970,362 | B1 * | 11/2005 | Chakravorty | H01L 23/50 257/E23.079 |
| 7,002,354 | B1 | 2/2006 | Pannell et al. | |
| 7,018,242 | B2 | 3/2006 | Brown et al. | |
| 7,049,693 | B2 * | 5/2006 | Canella | H01L 21/283 257/690 |
| 7,249,337 | B2 * | 7/2007 | Gisin | G06F 17/5036 257/678 |
| 7,375,532 | B1 * | 5/2008 | Lo | H04B 3/46 324/533 |
| 7,402,085 | B2 | 7/2008 | Hammond, Jr. et al. | |
| 7,889,512 | B1 * | 2/2011 | Borsch | H05K 1/181 361/763 |
| 8,119,921 | B1 * | 2/2012 | Goergen | H05K 1/111 174/255 |
| 8,482,465 | B1 * | 7/2013 | Hemmady | H01Q 1/36 333/262 |
| 8,541,690 | B2 * | 9/2013 | Voraberger | H01L 21/4846 174/260 |
| 2003/0063427 | A1 * | 4/2003 | Kunihiro | H01F 17/0006 361/277 |
| 2003/0112091 | A1 * | 6/2003 | Lemke | H01P 3/08 333/33 |
| 2003/0165051 | A1 * | 9/2003 | Kledzik | H01L 25/0652 361/760 |
| 2004/0031972 | A1 * | 2/2004 | Pflughaupt | H01L 23/50 257/200 |
| 2004/0150970 | A1 * | 8/2004 | Lee | H05K 1/0251 361/794 |
| 2004/0233010 | A1 * | 11/2004 | Akram | H01L 23/5225 333/1 |
| 2004/0257103 | A1 * | 12/2004 | Park | G01R 1/0483 324/756.05 |
| 2005/0026476 | A1 * | 2/2005 | Mok | C23C 18/00 439/81 |
| 2005/0134289 | A1 | 6/2005 | Barmettler | |
| 2005/0221660 | A1 * | 10/2005 | Coffey | H04Q 1/146 439/404 |
| 2006/0068582 | A1 * | 3/2006 | Su | H05K 1/0227 438/622 |
| 2006/0097739 | A1 * | 5/2006 | Machado | G01R 31/2808 324/750.16 |
| 2006/0107768 | A1 * | 5/2006 | Johnson | G01L 1/144 73/862.628 |
| 2007/0060970 | A1 * | 3/2007 | Burdon | A61N 1/3754 607/37 |
| 2007/0075432 | A1 * | 4/2007 | Shu | H01L 23/49838 257/774 |
| 2007/0081551 | A1 * | 4/2007 | Oishi | H04B 3/54 370/463 |
| 2007/0160182 | A1 * | 7/2007 | Kotze | H04B 3/46 379/1.01 |
| 2007/0222700 | A1 * | 9/2007 | De Flaviis | H01Q 1/2216 343/895 |
| 2007/0296461 | A1 * | 12/2007 | Wong | H04L 25/0272 326/82 |
| 2008/0048639 | A1 * | 2/2008 | Sutono | G01R 1/06772 324/76.19 |
| 2008/0082950 | A1 * | 4/2008 | Mathews | G06F 17/5068 716/50 |
| 2008/0136727 | A1 * | 6/2008 | Bit-Babik | H01Q 1/243 343/848 |
| 2008/0143379 | A1 * | 6/2008 | Norman | H01L 23/50 326/39 |
| 2008/0197859 | A1 * | 8/2008 | Flourens | H04B 3/46 324/612 |
| 2008/0265905 | A1 * | 10/2008 | Kadathur | G01R 31/2818 324/537 |
| 2008/0288906 | A1 * | 11/2008 | Kopischke | G06F 17/5068 716/118 |
| 2008/0297298 | A1 * | 12/2008 | Wei | H01F 21/12 336/200 |
| 2009/0298304 | A1 * | 12/2009 | Brunker | H01R 13/504 439/61 |
| 2009/0302317 | A1 * | 12/2009 | Okayasu | G01R 31/319 257/48 |
| 2009/0303144 | A1 * | 12/2009 | Hirano | H01Q 1/243 343/750 |
| 2009/0306918 | A1 * | 12/2009 | Driscoll | G01R 31/021 702/67 |
| 2010/0074415 | A1 | 3/2010 | Knudson et al. | |
| 2010/0096247 | A1 * | 4/2010 | Marie | G06F 3/045 200/5 A |
| 2010/0213951 | A1 * | 8/2010 | Lewis | H01L 23/576 324/649 |
| 2010/0267283 | A1 * | 10/2010 | Pischl | H01R 13/719 439/620.05 |
| 2011/0004861 | A1 * | 1/2011 | Jeong | G06F 17/5068 716/137 |
| 2011/0014818 | A1 * | 1/2011 | Carter | H01R 9/03 439/660 |
| 2011/0083881 | A1 * | 4/2011 | Nguyen | H05K 3/108 174/250 |
| 2011/0097935 | A1 * | 4/2011 | Schempp | H01R 9/091 439/620.22 |
| 2011/0104933 | A1 | 5/2011 | Straka et al. | |
| 2012/0051735 | A1 * | 3/2012 | Achkir | H04L 43/50 398/16 |
| 2012/0059605 | A1 * | 3/2012 | Chimanbhai | H04B 3/46 702/57 |

(56) References Cited

U.S. PATENT DOCUMENTS

| | | | |
|---|---|---|---|
| 2012/0100744 A1* | 4/2012 | Bolouri-Saransar | ........................ H01R 13/6469 439/404 |
| 2012/0139668 A1* | 6/2012 | Mina | ........................ H01P 3/003 333/238 |
| 2013/0037949 A1* | 2/2013 | Chong | ................... H05K 3/303 257/738 |
| 2013/0210277 A1 | 8/2013 | Robinson | |
| 2014/0015548 A1* | 1/2014 | Naughton | ............... G01R 27/26 324/658 |
| 2014/0326495 A1* | 11/2014 | Paniagua | ............. H05K 1/0251 174/266 |

OTHER PUBLICATIONS

"RJ45 to SMA Adapter Board User Manual", National Semiconductor, Part No. DS91C176EVK NOPB, Rev. 0.1, Jan. 2008.*
International Search Report and Written Opinion, filed in PCT/US2015/022029, dated Jun. 29, 2015; 9 pages.
International Search Report and Written Opinion, filed in PCT/US2015/050599, dated Dec. 28, 2015. 13 pages.
Further Examination Report, dated Mar. 2, 2016, from New Zealand Intellectual Property Office.

* cited by examiner

TESTING APPARATUS FOR A HIGH SPEED COMMUNICATIONS JACK AND METHODS OF OPERATING THE SAME

CROSS REFERENCE TO RELATED APPLICATIONS

This application is a continuation in part of U.S. patent application Ser. No. 13/739,214, filed Jan. 11, 2013, which is incorporated by reference herein in its entirety.

FIELD OF THE DISCLOSURE

The present disclosure relates to a testing framework of a network connection jack used to connect a network cable to a device.

BACKGROUND OF THE DISCLOSURE

As electrical communication devices and their associated applications become more sophisticated and powerful, their ability to gather and share information with other devices also becomes more important. The proliferation of these intelligent, inter networked devices has resulted in a need for increasing data throughput capacity on the networks to which they are connected to provide the improved data rates necessary to satisfy this demand. As a result, existing communication protocol standards are constantly improved or new ones created. Nearly all of these standards require or significantly benefit, directly or indirectly, from the communication of high-definition signals over wired networks. Transmission of these high definition signals, which may have more bandwidth and, commensurately, higher frequency requirements, need to be supported in a consistent fashion. However, even as more recent versions of various standards provide for theoretically higher data rates or speeds, they are still speed limited by the current designs of certain physical components. Unfortunately, the design of such physical components is plagued by a lack of understanding of what is necessary to achieve consistent signal quality at multi-gigahertz and higher frequencies.

For example, communication jacks are used in communication devices and equipment for the connection or coupling of cables that are used to transmit and receive the electrical signals that represent the data being communicated. A registered jack (RJ) is a standardized physical interface for connecting telecommunications and data equipment. The RJ standardized physical interface includes both jack construction and wiring pattern. A commonly used RJ standardized physical interface for data equipment is the RJ45 physical network interface, also referred to as an RJ45 jack. The RJ45 jack is widely used for local area networks such as those implementing the Institute of Electrical and Electronic Engineers (IEEE) 802.3 Ethernet protocol. The RJ45 jack is described in various standards, including one that is promulgated by the American National Standards Institute (ANSI)/Telecommunications Industry Association (TIA) in ANSI/TIA-1096-A.

All electrical interface components, such as cables and jacks, including the RJ45 jack, not only resist the initial flow of electrical current, but also oppose any change to it. This property is referred to as reactance. Two relevant types of reactance are inductive reactance and capacitive reactance. Inductive reactance may be created, for example, based on a movement of current through a cable that resists, which causes a magnetic field that induces a voltage in the cable. Capacitive reactance, on the other hand, is created by an electrostatic charge that appears when electrons from two opposing surfaces are placed close together.

To reduce or avoid any degradation of transmitted signals, the various components of a communications circuit preferably have matching impedances. If not, a load with one impedance value will reflect or echo part of a signal being carried by a cable with a different impedance level, causing signal failures. For this reason, data communication equipment designer and manufacturers, such as cable vendors, design and test their cables to verify that impedance values, as well as resistance and capacitance levels, of the cables comply with certain performance parameters. The RJ45 jack is also a significant component in nearly every communications circuit, however, jack manufacturers have not provided the same level of attention to its performance. Thus, although problems related to existing RJ45 jacks are well documented in tests and their negative impact on high frequency signal lines is understood, the industry seems reluctant to address the issues for this important component of the physical layer. Consequently, there is a need for an improved high speed jack

BRIEF SUMMARY OF THE DISCLOSURE

One embodiment of the present invention discloses a testing unit that includes a substrate, a plurality of vias located in the substrate, a plurality of pin traces having a height and a width and each extending from a respective via towards an edge of the substrate, a plurality of end traces having a height and a width with each end trace extending from an end of a respective pin trace towards the edge of the substrate, a plurality of branch traces having a height and a width and each extending from a side of a respective pin trace, and a plurality of traces extending from the end of a respective end trace, branch trace or pin trace to the edge of the substrate where each end trace is adjacent to a respective branch trace, each end trace is adjacent to a respective branch trace on one side and a pin trace on the opposite side, and each pin trace is adjacent to another pin trace on one side.

In another embodiment, each pin trace is separated from each trace by a first distance.

In another embodiment, each end trace is separated from each trace by a second distance.

In another embodiment, each branch trace is separated from the adjacent end trace by a third distance.

In another embodiment, adjacent pin traces are separated by a forth distance.

In another embodiment, the testing unit includes a grounding plane in the substrate that is separated from each trace by a distance.

In another embodiment, the height and width of adjacent traces and a distance separating adjacent traces are adjusted such that the adjacent traces are magnetically coupled.

In another embodiment, the inductance and capacitance of each trace is adjusted by adjusting the first distance between the grounding plane and each trace.

In another embodiment, the height and width of adjacent end traces and branch traces are adjusted such that the end traces are magnetically coupled to adjacent branch traces.

In another embodiment, the substrate is RO XT8100, Rogers material.

In another embodiment, the capacitance of each trace is adjusted to between approximately 0.51 picofarads (pF) to approximately 2 pf.

In another embodiment, the testing unit includes a second ground plane positioned between the first ground plane and a surface of the substrate opposite the surface of the substrate having the plurality of traces.

In another embodiment, the inductance and capacitance of each trace is adjusted by adjusting a distance between the first ground plane and second ground plane and a distance between the first ground plane and each trace.

In another embodiment, a pin of an RJ 45 jack is connected to each via.

In another embodiment, an end of each trace is coupled to a connection unit.

In another embodiment, the connection unit is an RJ 45 connector.

In another embodiment, the height and width of adjacent pin traces and a distance separating adjacent pin traces are adjusted such that the adjacent pin traces are magnetically coupled.

In another embodiment, the height and width of adjacent end traces and branch traces and the distance separating adjacent end traces and branch traces are adjusted such that the adjacent end traces and branch traces are magnetically coupled.

In another embodiment, the inductance and capacitance of each end trace and branch trace are adjusted by adjusting the distance between the grounding plane and each end trace and each branch trace.

In another embodiment, the inductance and capacitance of each pin trace is adjusted along the length of the trace by adjusting the predetermined distance between the grounding plane and each end trace.

Another embodiment of the present invention includes a method of testing a high speed communication jack including the steps of adjusting the capacitance and inductance of adjacent traces along the length of each adjacent trace by modifying a distance between each adjacent trace and a ground plane embedded in the substrate, adjusting the height, width and separation distance of adjacent traces on a substrate such that two adjacent traces are magnetically coupled, transmitting a signal from a first signal generator across each adjacent trace to a high speed communication jack, transmitting the signal from the high speed communication jack across a cable, receiving the signal at a signal receiving device, and comparing the received signal with the transmitted signal to determine the differences in the signal.

In another embodiment, the high speed communication jack is a RJ 45 communication jack.

In another embodiment, the substrate is RO XT8100, Rogers material. In another embodiment, the capacitance of each adjacent trace is adjusted to between approximately 0.51 picofarads (pF) to approximately 2 pF.

DETAILED DESCRIPTION OF THE DISCLOSURE

Figure 1:
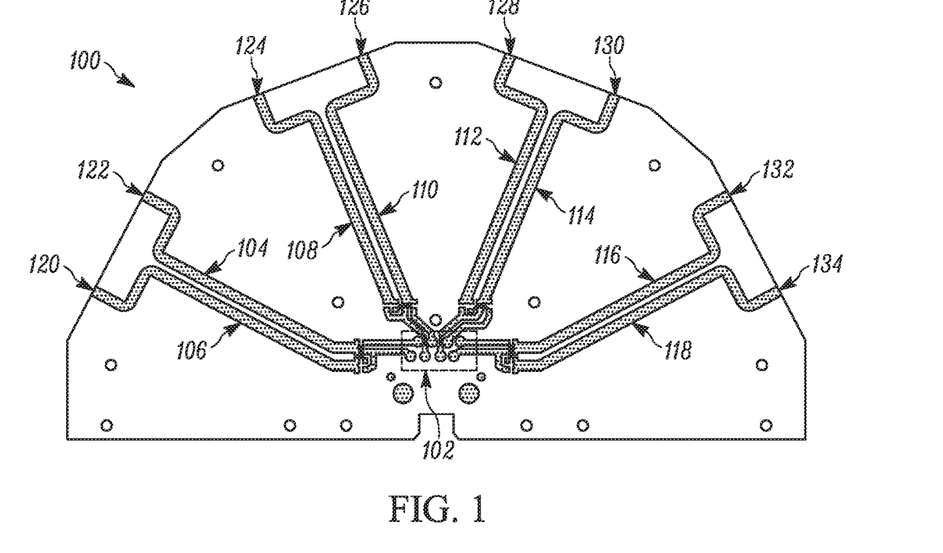
FIG. 1 illustrates a testing unit for a high speed communication jack.

FIG. 1 illustrates a testing unit 100 for a high speed communication jack. The testing unit 100, or testing framework, includes a pin connection portion 102 that is configured to affix to a high speed communication jack such as, but not limited to, a RJ 45 communication jack. Traces 104, 106, 108, 110, 112, 114, 116 and 118 extend radially from the pin connection portion 102 to the outer edge of the testing unit 100. The end of each trace 104, 106, 108, 110 112, 114, 116 and 118 terminates at the edge of the testing unit 100 to allow for the connection of a communication unit (not shown). The connection units 120, 122, 124, 126, 128, 130, 132 and 134 may be any type of connector including, but not limited to a RJ 45 connector.

Figure 2:
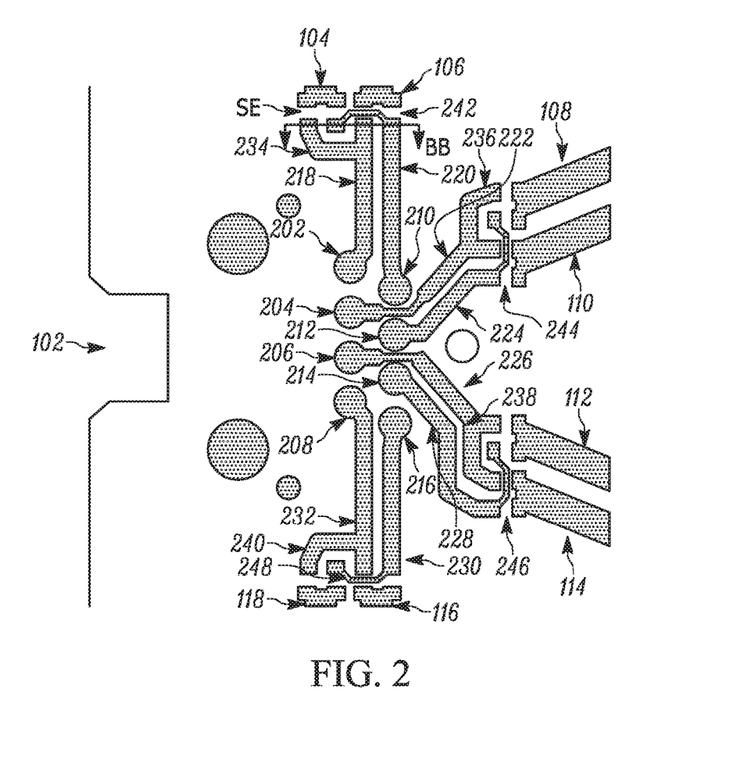
FIG. 2 illustrates a matching portion of the testing unit of FIG. 1.

FIG. 2 depicts a blown up view of the connection portion 102. The connection portion 102 includes vias 202, 204, 206, 208, 210, 212, 214, and 216 that are sized to engage the pins of a high speed communication jack. Pin traces 218, 220, 222, 224, 226, 228, 230 and 232 extend radially from the vias 202, 204, 206, 208, 210, 212, 214, and 216 towards the traces 104, 106, 108, 110, 112, 114, 116 and 118. Each pin trace 218, 220, 222, 224, 226, 228, 230 and 232 is matched to an adjacent pin trace 218, 220, 222, 224, 226, 228, 230 or 232. As an illustrative example, pin trace 218 is matched to pin trace 220, pin trace 222 is match with pin trace 224, pin trace 226 is matched to pin trace 228 and pin trace 230 is matched to pin trace 232. Each pin trace 218, 220, 222, 224, 226, 228, 230 and 232 and 234 has a length (L), a height (H) and a width (W), and is separated from an adjacent pin trace by a distance (S). The width of each pin trace 218, 220, 222, 224, 226, 228, 230 and 232 is approximately 35 mils. By adjusting the length, height and width of adjacent pin traces, the inductance of adjacent pin traces can be matched. The end of each pin trace 218, 220, 222, 224, 226, 228, 230 and 232 is separated from a respective trace 104, 106, 108, 110, 112 or 114 by a predetermined distance (Se).

Branch traces 234, 236, 238 and 240 extend from one side of a respective pin trace 218, 222, 226 and 232. End traces 242, 244, 246, and 248 extend from the end of each pin trace 220, 224, 228 and 230 towards the respective matched pin such that the end trace 242, 244, 246 and 248 is substantially parallel to the corresponding branch trace 234, 236, 238 and 240 and is positioned between the end of each pin trace 218, 220, 222, 224, 226, 228, 230 or 232 and the end of each trace 102, 104, 106, 108, 110, 112 or 114. The end traces 242, 244, 246 and 248 and branch traces 234, 236, 238 and 240 are separated from the ends of each respective trace 102, 104, 106, 108, 110, 112 or 114 by the predetermined distance Se. In one embodiment, the distance Se, is constant along the length of the end trace 236, 238, 240, 242, 244, 246, 248 or 250. In another embodiment, the distance Se, varies along the length of the end trace 236, 238, 240, 242, 244, 246, 248 or 250. Each branch trace 234, 236, 238 and 240 and each end trace 242, 244, 246 and 248 has a length (L), width (W) and height (H). By adjusting the length, height and width of each branch trace 234, 236, 238 and 240 and each end trace 242, 244, 246 and 248 in conjunction with the separation distance Se, different inductive and conductive configurations can be achieved. By matching the conductive and inductive patterns of two adjacent traces, the traces can be magnetically coupled. The width of each branch trace 234, 236, 238 and 240 may be approximately 35 mils. The width of each end trace 242, 244, 246 and 248 may be approximately 10 mils.

Figure 3:
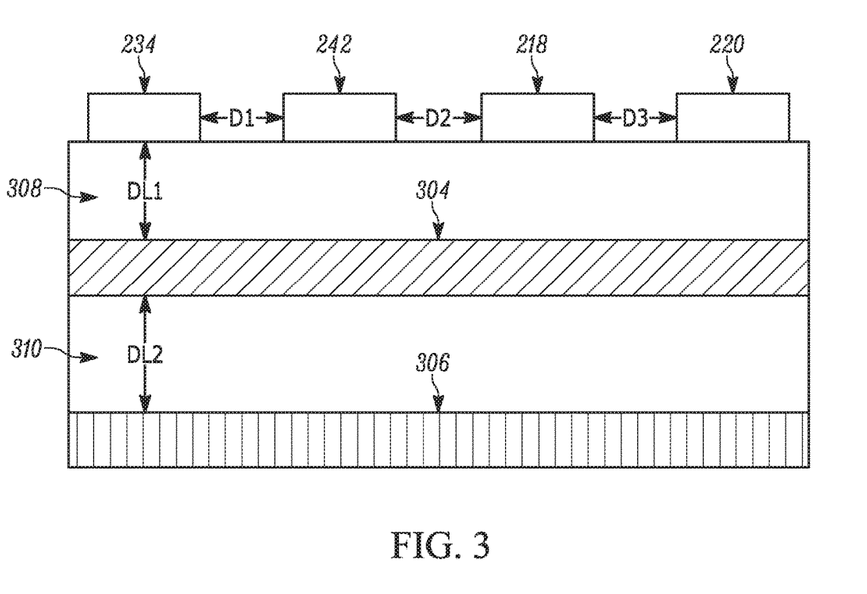
FIG. 3 is a schematic diagram of the testing unit of FIG. 1.

FIG 3 depicts a cut away view of the connection portion 102. The connection portion 102 includes a top surface 302. The pin trace(s) 218, 220, 234 and 242 are positioned on the top surface 302 and a first grounding trace 306 and a second grounding trace 306 are positioned in the dielectric layers below the top surface with the first grounding trace 306 being separated from the top surface 302 by a first dielectric layer having a height H1. The second grounding trace 308 is separated from the first grounding trace 304 by a second dielectric layer 310 having a second height H2. By adjusting the heights H1 and H2 of the dielectric layers 308 and 310, the capacitance of each trace can be adjusted. Further, the impedance of each trace 218, 220, 234 and 242 can be adjusted by modifying the length, width and height of each trace 218, 220, 234 and 242. By adjusting the impedance of adjacent traces, the adjacent traces can be magnetically coupled to one another eliminating crosstalk or noise. The dielectric layers are made from a material having a dielectric constant greater than 3.0 such as, but not limited to, RO XT8100, ROGERS Material, or any other material capable of isolating a high frequency electrical signal.

Figure 4:
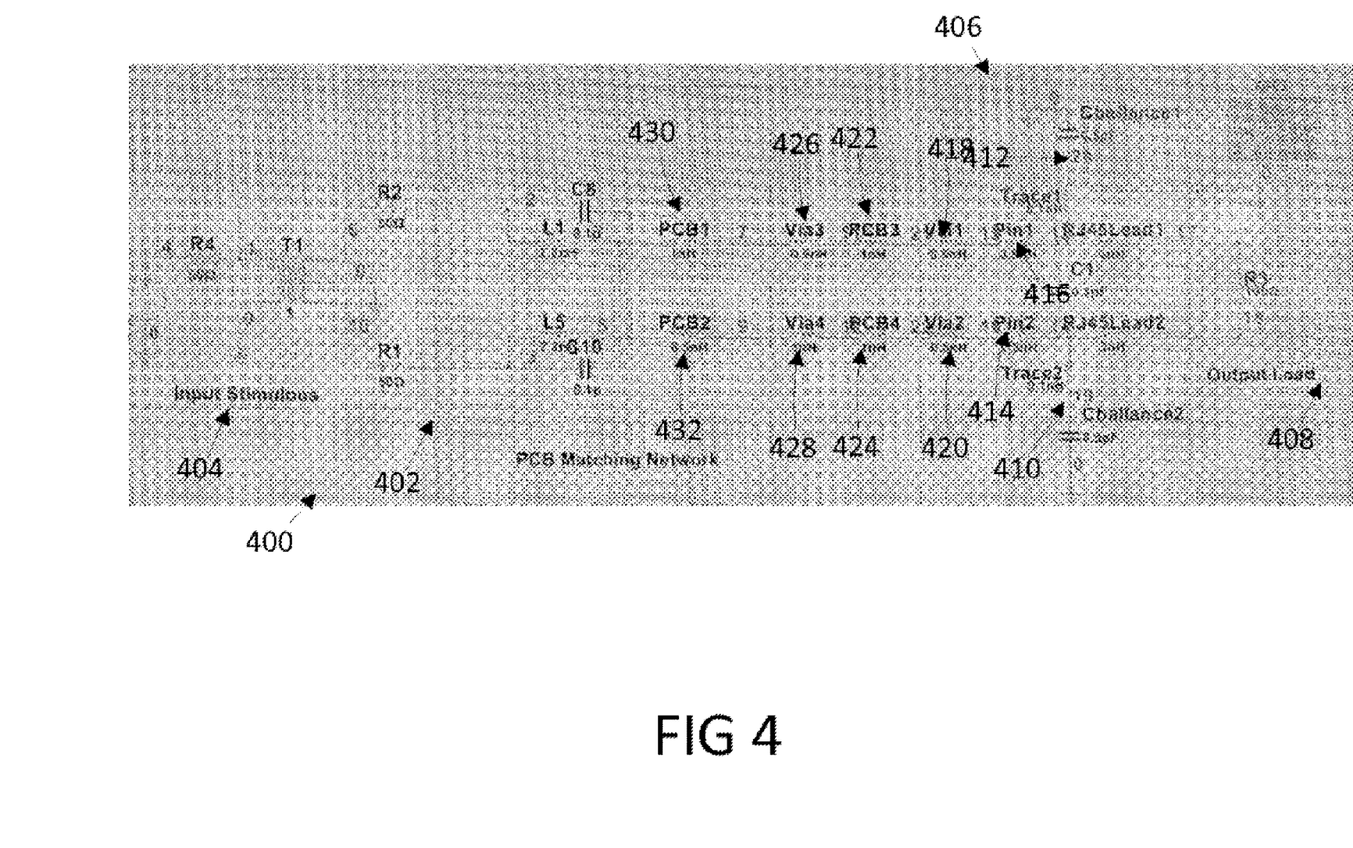
FIG. 4 depicts a diagram of the circuit formed in the testing unit of FIG. 1.

FIG. 4 depicts a diagram of the circuit formed in the testing unit 100. The schematic includes the connection portion 402, an input stimulus 404, a RJ 45 high speed communication jack 406 and a output load 408. The RJ 45 jack 406 includes internal traces 410 and 412 that are connected to pins 414 and 416 which engage vias 418 and 420. The vias 418 and 410 are electrically connected to the pin traces 422 and 424 on the testing unit 100. The inductance at various points along the pin traces 422 and 424 and traces are represented by inductors PCB 3 and 4 and via 3 and 4. The inductance of each trace is changed by adjusting the height H1 of the dielectric layer under the pin traces and the height H2 between the second grounding trace 306 and first grounding trace 304 under each trace. The inductance and capacitance of the branch traces and end traces are represented by capacitors C8 and C10 and inductors L1 and L5. The capacitors C8 and C10 are adjusted by changing the height, width and length of the end traces and branch traces in conjunction with the distance between the end traces 242, 244, 246 and 248 and branch traces 234, 236, 238 and 240. The inductance of the branch traces 234, 236, 238 and 240 and end traces 242, 244, 246 and 248 are changed by adjusting the height H1 of the dielectric layer under the end or branch trace traces and the height H2 between the second grounding trace 306 and first grounding trace 304 under each end or branch trace. The capacitors created by the traces, including the pin traces, end traces and branch traces, and the grounding traces 304 and 306 are sized between approximately 0.51 picofarads (pF) to approximately 2 pf. The top and bottom surfaces of the unit 100 may be covered in a plastic insulating layer to further enhance the operation of the circuit. In one embodiment, signals are driven through the line using between approximately 4 mW of power and 20 mW of power.

Figure 5:
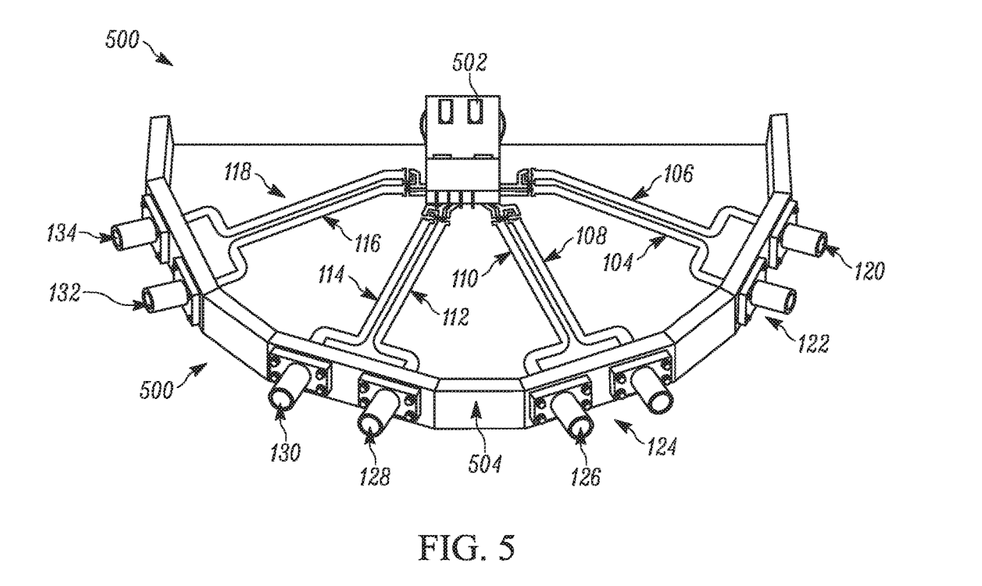
FIG. 5 depicts one embodiment of a testing unit for a high speed communication jack.

FIG. 5 depicts one embodiment of a testing unit for a high speed communication jack. The testing unit 500 includes a high speed communication jack 502 connected to the connection portion 102 of the testing unit 500 may be a RJ type connector, Universal Serial Bus (USB) connector and jack, Fire-wire (1394) connector and jack, HDMI (High-Definition Multimedia Interface) connector and jack, D-subminiature type connector and jack, ribbon type connector or jack, or any other connector or jack receiving a high speed communication signal. The high speed communication jack 502 is connected to the connection portion 102 such that each pin on the high speed communication jack 502 corresponds to one of the vias 202, 204, 206, 208, 210, 212, 214 and 216. The high speed communications jack 502 may be configured such that pairs of pins are magnetically coupled together.

Each trace 104, 106, 108, 110, 112, 114, 116 and 118 extends from the connection portion 102 to the connection units 120, 122, 124, 126, 128, 130, 132 and 134. The connection units 120, 122, 124, 126, 128, 130, 132 and 134 are configured such that a cable having a connector, such as a RJ 45 connector, can be removably attached to each of the connection units 120, 122, 124, 126, 128, 130, 132 and 134. The connection units 120, 122, 124, 126, 128, 130, 132 and 134 transmit signals from the cable connected to the connection unit 120, 122, 124, 126, 128, 130, 132 and 134 and the associated trace 104, 106, 108, 110, 112, 114, 116 or 118 connected to the connection unit 120, 122, 124, 126, 128, 130, 132, and 134. The connection units 104, 106, 108, 110, 112, 114, 116 and 118 are affixed to a connection plate 504 that extends around the periphery of the testing unit 500. The connection plate 504 may be made of metal, such as steel, or plastic. Each of the connection units 120, 122, 124, 126 128, 130, 132, and 134 are affixed to the side surface of the connection plate 504 such that the central axis of the connection unit 120, 122, 124, 126, 128, 130, 132 and 134 is substantially parallel to the surface of the testing unit 500.

Figure 6:
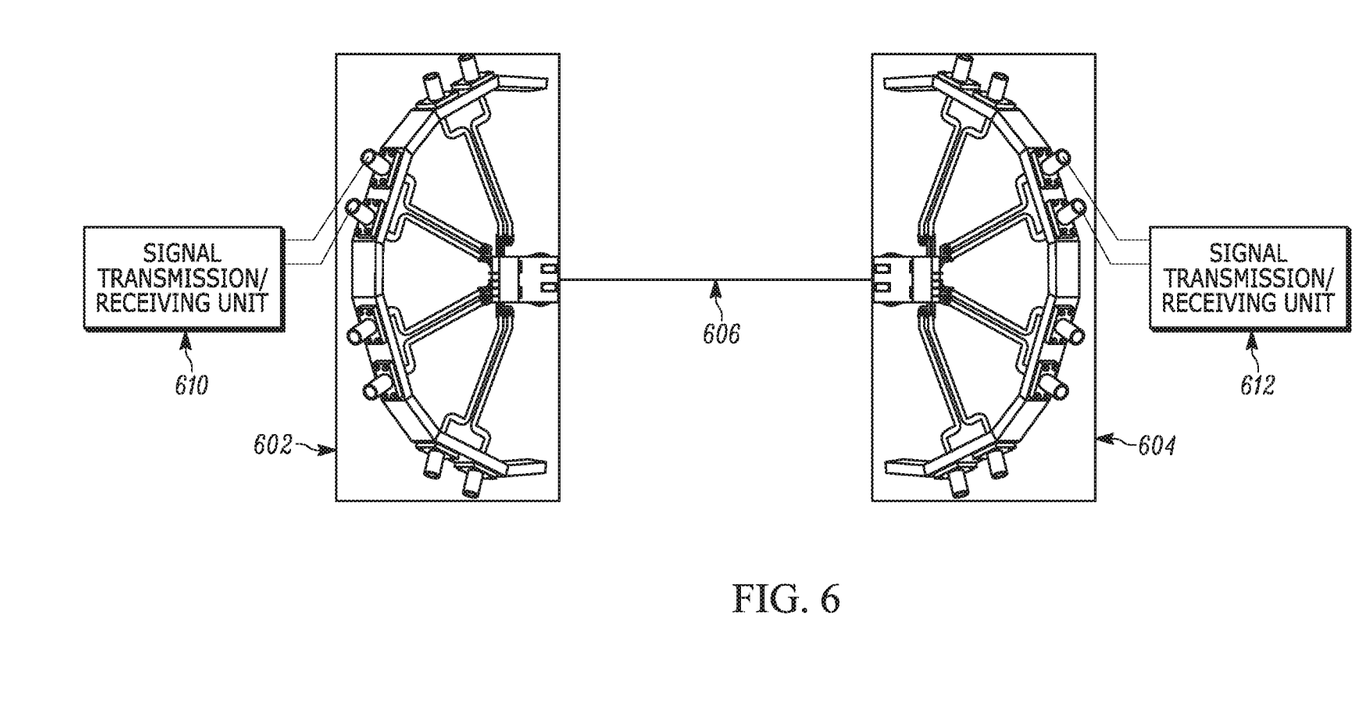
FIG. 6 depicts one embodiment of the connection of two testing unit s for high speed connection jacks.

FIG. 6 depicts a schematic representation of the testing units connected together across a network. A first testing unit 602 is connected to a second testing unit 604 by a cable 606 connected to the high speed communication jack on each of the testing unit 602 and 604. The cable 606 may be a communication cable such as an Ethernet cable, a category 5, 6, or 7 cable, a serial cable, a Fire-wire cable, a USB cable or any other type of communication cable. The cable 606 includes connectors (not shown) to allow the cable 606 to be removably connected to the high speed communication jacks. In one embodiment, the high speed communication jack on the first testing unit 602 is the same type of high speed communication jack as the second testing unit 604. In another embodiment, the high speed communication jack on the first testing unit 602 is a different type than the high speed communication jack on the second testing unit 604. The cable can be of any length including, but not limited to, 3 feet, 6, feet, 10 feet, 12 feet, 15 feet or 20 feet.

The connection units 120, 122, 124, 126, 128, 130, 132, and 134 each connect to a signal transmission and receiving unit 610 and 612 via cables coupled to the connection units 120, 122, 124, 126, 128, 130, 132 and 134 on one end and to the signal transmission and receiving units 610 and 612 on the opposite end. In one embodiment, the signal transmission and receiving unit 610 transmits a signal from the first testing unit 602 to the second testing unit 604 via the high speed connection jacks on the first and second testing units 602 and 604. Upon receiving the signal, the second testing unit 604 transmits the signal to the signal transmission and receiving unit 612. In one embodiment, the signal transmission and receiving unit 612 transmits a new signal back to the signal transmission and receiving unit 610 over the cable 606. In one embodiment, the signal transmission and receiving unit 612 transmits a second signal to the signal transmission and receiving unit 612 that is based on the signal previously transmitted by the signal transmission and receiving unit 610. In another embodiment, the signal transmission and receiving unit 612 transmits a second signal to the signal transmission and receiving unit 610 that is substantially identical to the signal previously transmitted by the signal transmission and receiving unit 610.

The preceding detailed description is merely some examples and embodiments of the present disclosure and that numerous changes to the disclose embodiments can be made in accordance with the disclosure herein without departing from its spirit or scope. The preceding description, therefore, is not meant to limit the scope of the disclosure but to provide sufficient disclosure to one of ordinary skill in the art to practice the invention with undue burden.

The invention claimed is:

1. A testing unit including:
   a substrate;
   a plurality of vias located in the substrate in a pin connection region;
   a plurality of pin traces in the pin connection region having a height and a width and each extending from a respective via towards an edge of the pin connection region;
   a plurality of end traces having a height and a width with each end trace extending from an end of a respective pin trace towards an edge of the pin connection region;
   a plurality of branch traces having a height and a width and each extending from a side of a respective pin trace in the pin connection region;
   a plurality of traces outside the pin connection area where each trace extends from the end of a respective end trace, branch trace or pin trace to an edge of the substrate and each trace is separated from the pin connection area by a first distance,
   wherein
   each end trace is adjacent to a respective branch trace,
   an end of each end trace is adjacent to an end of a respective branch trace on one side of the end trace and an end of a pin trace on the opposite side of the end trace, and
   each pin trace is adjacent to another pin trace on one side.

2. The testing unit of claim 1 wherein each pin trace is separated from each trace by a first distance.

3. The testing unit of claim 1 wherein each end trace is separated from each trace by a second distance.

4. The testing unit of claim 1 wherein each branch trace is separated from the adjacent end trace by a third distance.

5. The testing unit of claim 1 wherein adjacent pin traces are separated by a forth distance.

6. The testing unit of claim 1 including a grounding plane in the substrate that is separated from each trace by a distance.

7. The testing unit of claim 1 wherein the height and width of adjacent traces and a distance separating adjacent traces are adjusted such that the adjacent traces are magnetically coupled.

8. The testing unit of claim 6 wherein the inductance and capacitance of each trace is adjusted by adjusting the first distance between the grounding plane and each trace.

9. The testing unit of claim 4 wherein the height and width of adjacent end traces and branch traces are adjusted such that the end traces are magnetically coupled to adjacent branch traces.

10. The testing unit of claim 1 wherein the substrate is RO XT8100, Rogers material.

11. The testing unit of claim 8 wherein the capacitance of each trace is adjusted to between approximately 0.51 picofarads (pF) to approximately 2 pF.

12. The testing unit of claim 6 including a second ground plane positioned between the first ground plane and a surface of the substrate opposite the surface of the substrate having the plurality of traces.

13. The testing unit of claim 12 wherein the inductance and capacitance of each trace is adjusted by adjusting a distance between the first ground plane and second ground plane and a distance between the first ground plane and each trace.

14. The testing unit of claim 1 wherein a pin of an RJ 45 jack is connected to each via.

15. The testing unit of claim 1 wherein an end of each trace is coupled to a connection unit.

16. The testing unit of claim 15 wherein the connection unit is an RJ 45 connector.

17. The testing unit of claim 1 wherein the height and width of adjacent pin traces and a distance separating adjacent pin traces are adjusted such that the adjacent pin traces are magnetically coupled.

18. The testing unit of claim 1 wherein the height and width of adjacent end traces and branch traces and the distance separating adjacent end traces and branch traces are adjusted such that the adjacent end traces and branch traces are magnetically coupled.

19. The testing unit of claim 6 wherein the inductance and capacitance of each end trace and branch trace are adjusted by adjusting the distance between the grounding plane and each end trace and each branch trace.

20. The testing unit of claim 6 wherein the inductance and capacitance of each pin trace is adjusted along the length of the trace by adjusting the predetermined distance between the grounding plane and each end trace.

* * * * *